(12) United States Patent
Chen

(10) Patent No.: US 10,041,999 B2
(45) Date of Patent: Aug. 7, 2018

(54) INTERFACE CHIP AND TEST METHOD THEREFOR

(71) Applicant: VIA TECHNOLOGIES, INC., New Taipei (TW)

(72) Inventor: Shih-Hao Chen, New Taipei (TW)

(73) Assignee: VIA TECHNOLOGIES, INC., New Taipei (TW)

( * ) Notice: Subject to any disclaimer, the term of this patent is extended or adjusted under 35 U.S.C. 154(b) by 92 days.

(21) Appl. No.: 15/411,063

(22) Filed: Jan. 20, 2017

(65) Prior Publication Data

US 2018/0164374 A1 Jun. 14, 2018

(30) Foreign Application Priority Data

Dec. 13, 2016 (TW) .............................. 105141176 A

(51) Int. Cl.
*G01R 31/317* (2006.01)
*G01R 31/3177* (2006.01)

(52) U.S. Cl.
CPC ... *G01R 31/31707* (2013.01); *G01R 31/3177* (2013.01); *G01R 31/31723* (2013.01); *G01R 31/31724* (2013.01)

(58) Field of Classification Search
CPC ........ G01R 31/31707; G01R 31/31723; G01R 31/31724; G01R 31/3177
See application file for complete search history.

(56) References Cited

U.S. PATENT DOCUMENTS

| | | | |
|---|---|---|---|
| 6,836,515 B1 | 12/2004 | Kay et al. | |
| 7,340,662 B1 | 3/2008 | McElwee et al. | |
| 9,626,321 B2* | 4/2017 | Safranek | G06F 13/4022 |
| 9,692,589 B2* | 6/2017 | Iyer | H04L 7/027 |
| 2014/0112339 A1* | 4/2014 | Safranek | G06F 13/4221 370/389 |
| 2014/0160944 A1 | 6/2014 | Venkatesan et al. | |
| 2016/0179740 A1* | 6/2016 | Halleck | G06F 13/4221 710/106 |
| 2016/0313399 A1 | 10/2016 | Lin et al. | |
| 2017/0019247 A1* | 1/2017 | Iyer | H04L 7/027 |

FOREIGN PATENT DOCUMENTS

| | | |
|---|---|---|
| CN | 1728626 A | 2/2006 |
| TW | 201101024 A | 1/2011 |

\* cited by examiner

*Primary Examiner* — Kyle Vallecillo
(74) *Attorney, Agent, or Firm* — McClure, Qualey & Rodack, LLP

(57) ABSTRACT

A built-in self-test mechanism for an interface chip. During a loopback test procedure, a transmission terminal of the interface chip is coupled back to the interface chip by a reception terminal of the interface chip and a loopback test circuit within the interface chip generates a test sequence which includes a synchronization section and a section of repeated test code. The test sequence is scrambled by a scrambler and then is transmitted via the transmission terminal and looped back to the reception terminal. The signal looped back to the reception terminal is processed by an equalizer and descrambled by a descrambler to be further checked by the loopback test circuit for determining whether the interface chip is functioning normally. The dynamically-changed keys used in the scrambler and the descrambler are synchronized according to the synchronization section. The equalizer is optimized by the scrambled section of repeated test code.

20 Claims, 3 Drawing Sheets

US 10,041,999 B2

INTERFACE CHIP AND TEST METHOD THEREFOR

CROSS REFERENCE TO RELATED APPLICATIONS

This Application claims priority of Taiwan Patent Application No. 105141176, filed on Dec. 13, 2016, the entirety of which is incorporated by reference herein.

BACKGROUND OF THE INVENTION

Field of the Invention

The present invention relates to test technology for an interface chip.

Description of the Related Art

In conventional techniques, an interface chip is tested by automatic test equipment (ATE). The interface chip to be tested is put onto the ATE, and the ATE checks the signal accuracy at a transmission terminal (TX terminal) of the interface chip, and it also tests the receiver function of the interface chip by generating test data for the interface chip and coupling the test data to the interface chip by a reception terminal (RX terminal) of the interface chip.

Because the data rate of interface chips has been increased considerably by developments in semiconductor technology, a more enhanced ATE is required. For example, an ATE for an interface chip using a high-speed universal serial bus, such as USB 3.0, USB 3.1 and so on, is very complex and expensive.

BRIEF SUMMARY OF THE INVENTION

A built-in self-test technology for an interface chip is disclosed.

An interface chip in accordance with an exemplary embodiment of the disclosure includes a transmission terminal (TX terminal), a reception terminal (RX terminal), a loopback test circuit, a scrambler, an equalizer and a descrambler. During a loopback test procedure, the TX terminal is connected back to the RX terminal and the loopback test circuit generates a test sequence which includes a synchronization section and a section of repeated test code. The test sequence is scrambled by the scrambler to be transmitted via the transmission terminal and then looped back to the reception terminal. The signal transmitted from the transmission terminal and looped back to the reception terminal is processed by the equalizer and then descrambled by the descrambler to be checked further by the loopback test circuit for determining whether the interface chip is functioning normally. The dynamically-changed keys used in the scrambler and the descrambler are synchronized according to the synchronization section. The equalizer is optimized by the scrambled section of repeated test code.

In another exemplary embodiment, a test method for an interface chip includes the following steps: connecting a transmission terminal of the interface chip back to a reception terminal of the interface chip; driving the interface chip to generate a test sequence which includes a synchronization section and a section of repeated test code; using a scrambler to scramble the test sequence to be transmitted via the transmission terminal and then looped back to the reception terminal; and processing the signal transmitted from the transmission terminal and looped back to the reception terminal by an equalizer and then descrambling the signal from the equalizer by a descrambler to be further checked for determining whether the interface chip is functioning normally. The dynamically-changed keys used in the scrambler and the descrambler are synchronized according to the synchronization section. The equalizer is optimized by the scrambled section of repeated test code.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
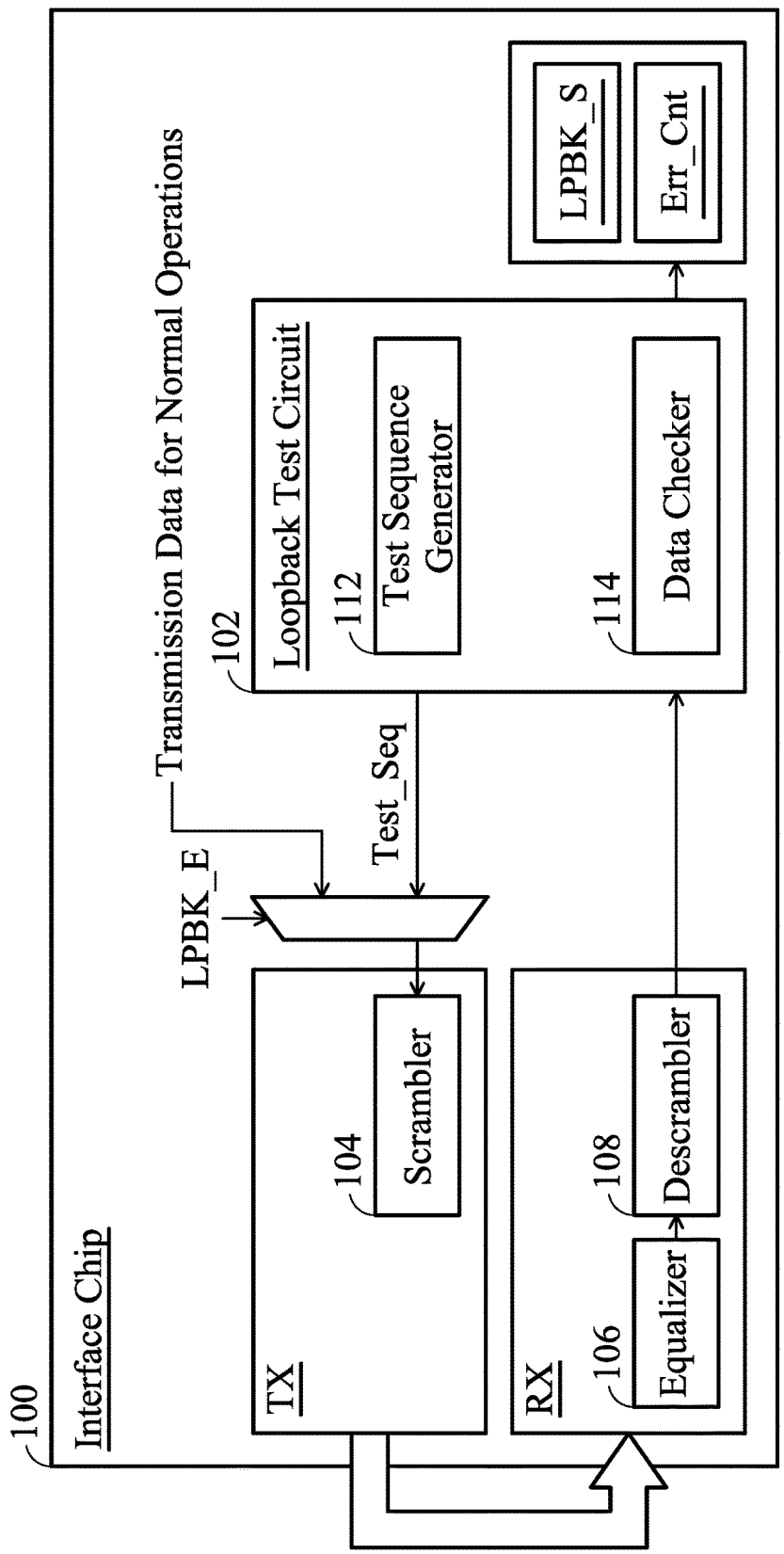
FIG. 1 is a block diagram depicting an interface chip 100 in accordance with an exemplary embodiment of the disclosure.

FIG. 1 is a block diagram depicting an interface chip 100 in accordance with an exemplary embodiment of the disclosure. The interface chip 100 includes a transmission terminal (TX terminal), a reception terminal (RX terminal), a loopback test circuit 102, a scrambler 104, an equalizer 106, a descrambler 108, a register LPBK_S for loopback path confirmation and a register Err_Cnt changed in accordance with an error count. During a loopback test procedure, the TX terminal is connected back to the RX terminal. The signal transmitted from the interface chip 100 is looped back to be checked by the interface chip 100 itself. The interface chip 100, therefore, does not need to be verified by an additional, complex test board. The register LPBK_S and the register Err_Cnt are provided to show whether the interface chip 100 is functioning normally.

The loopback test circuit 102 includes a test sequence generator 112 and a data checker 114. The loopback test circuit 102 uses the test sequence generator 112 to generate a test sequence Test_Seq. The test sequence Test_Seq includes a synchronization section (e.g., a "SYNC order set" defined in USB 3.1 G2) and a section of repeated test code (e.g., repeatedly transmitted code "Logic_Idle" defined in USB 3.1 G2) following the synchronization section. According to an enable signal LPBK_E for enabling the loopback test procedure, the test sequence Test_Seq, rather than the transmission data for normal operations, is transmitted to the scrambler 104. The test sequence Test_Seq is scrambled by the scrambler 104 and then transmitted via the transmission terminal TX and looped back to the reception terminal RX. The signal that the reception terminal RX receives from the transmission terminal TX is processed by the equalizer 106 and then descrambled by the descrambler 108 to be further transmitted to the loopback test circuit 102. The loopback test circuit 102 operates the data checker 114 to check the received signal and thereby determines whether the interface chip 100 is functioning normally. Note that the scrambled section of repeated test code is more in line with the actual situation of the transmission data for normal operations. The reliability of the loopback test procedure, therefore, is obviously improved. Furthermore, the emulated transmission data (the scrambled section of repeated test code) is also used in training the equalizer 106. The equalizer 106, therefore, is optimized. Specifically, the scrambler 104 and the descrambler 108 use dynamically-changed keys. The dynamically-changed keys of the scrambler 104 and the descrambler 108 are synchronized according to the synchronization section.

The register LPBK_S for loopback path confirmation is asserted when the loopback test circuit 102 successfully receives the synchronization section. If the register LPBK_S has not been asserted and the timeout period for the loopback test procedure has elapsed, it means that the interface chip 100 is malfunctioning. The register LPBK_S that has not been asserted represents a failure of the loopback path.

In an exemplary embodiment, N occurrences of correct recognition of the test code are required before the recognition error of the test code is considered in determining whether the interface chip 100 is functioning normally. This design not only ensures the reliability of the loopback path but also avoids misjudgment of the scrambled test code. In an exemplary embodiment, after N occurrences of correct recognition of the test code, every time the recognized data does not match the synchronization section or the test code, the error count record in the register Err_Cnt is increased. If the error count record in the register Err_Cnt is greater than a threshold value after the timeout period for the loopback test procedure has elapsed, it means that the interface chip 100 is malfunctioning. The threshold value depends on the designer. The more stringent quality requirement corresponds to a lower threshold value.

Figure 2:
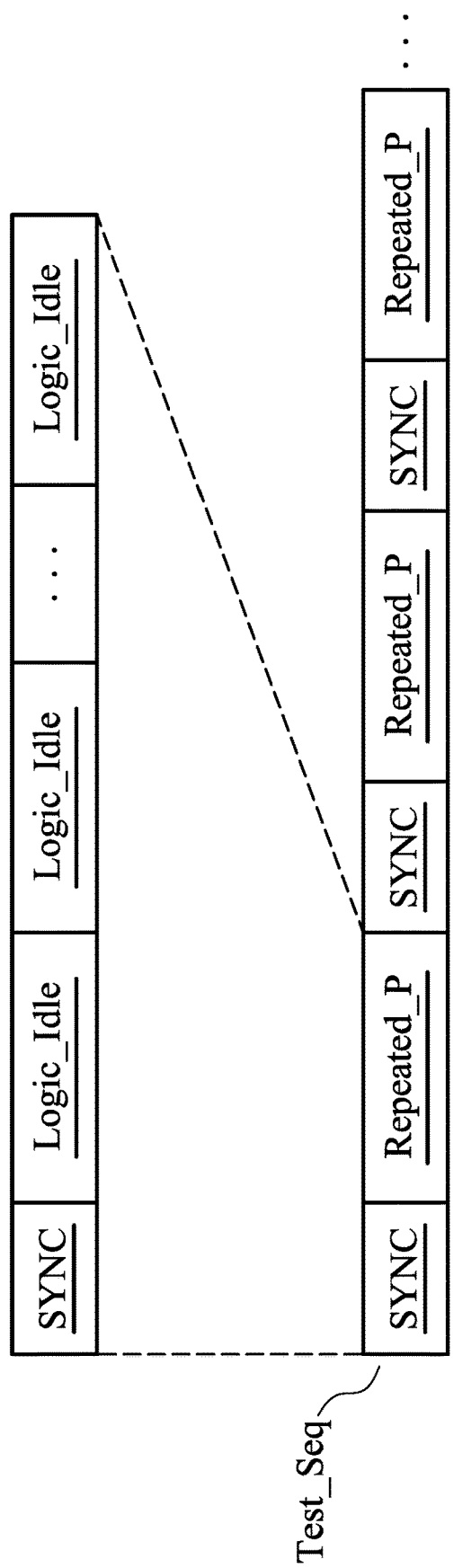
FIG. 2 depicts the test sequence Test_Seq in accordance with an exemplary embodiment of the disclosure.

FIG. 2 depicts the test sequence Test_Seq in accordance with an exemplary embodiment of the disclosure. One code section SYNC and another code section Repeated_P are repeatedly transmitted as the test sequence Test_Seq. The code section SYNC is the synchronization section (e.g., a "SYNC order set" defined in USB 3.1 G2) for synchronizing (e.g. resetting) the scramble/descramble key. The code section Repeated_P following the synchronization section SYNC includes a series of digital code, which may be repeated test code (i.e. repeating the test code up to a predefined number of times). As shown in FIG. 2, "Logic_Idle" defined in USB 3.1 G2 is repeatedly transmitted as the series of digital code following the synchronization section SYNC. The data content of "Logic_Idle" is 5A.

In an exemplary embodiment, the scramble key of the scrambler 104 is dynamically changed and depends on the data received by the scrambler 104. According to the data being scrambled, the scramble key changes for the next data scrambling. The descramble key adopted by the descrambler 108 similarly changes dynamically. As shown in FIG. 2, the synchronization key SYNC is transmitted periodically to periodically synchronize (known as a "reset") the dynamically-changed keys of the scrambler 104 and the descrambler 108. In each code section Repeated_P, the repeated number of the test code Logic_Idle depends on the necessary training time of the equalizer 106. The equalizer 106 needs to be trained with a variety of training data. The more times the test code Logic_Idle is repeated, the more versions of the scramble key are adopted and the more diverse the training sequence is.

In an exemplary embodiment, the loopback test circuit 102 further uses the test sequence generator 112 to insert the time compensation code (e.g. a "SKP order set" defined in USB 3.1 G2) into the test sequence Test_Seq. The time compensation code is removed before being sent back to the loopback test circuit 112. The data checker 114 does not have to check the time compensation code.

Figure 3:
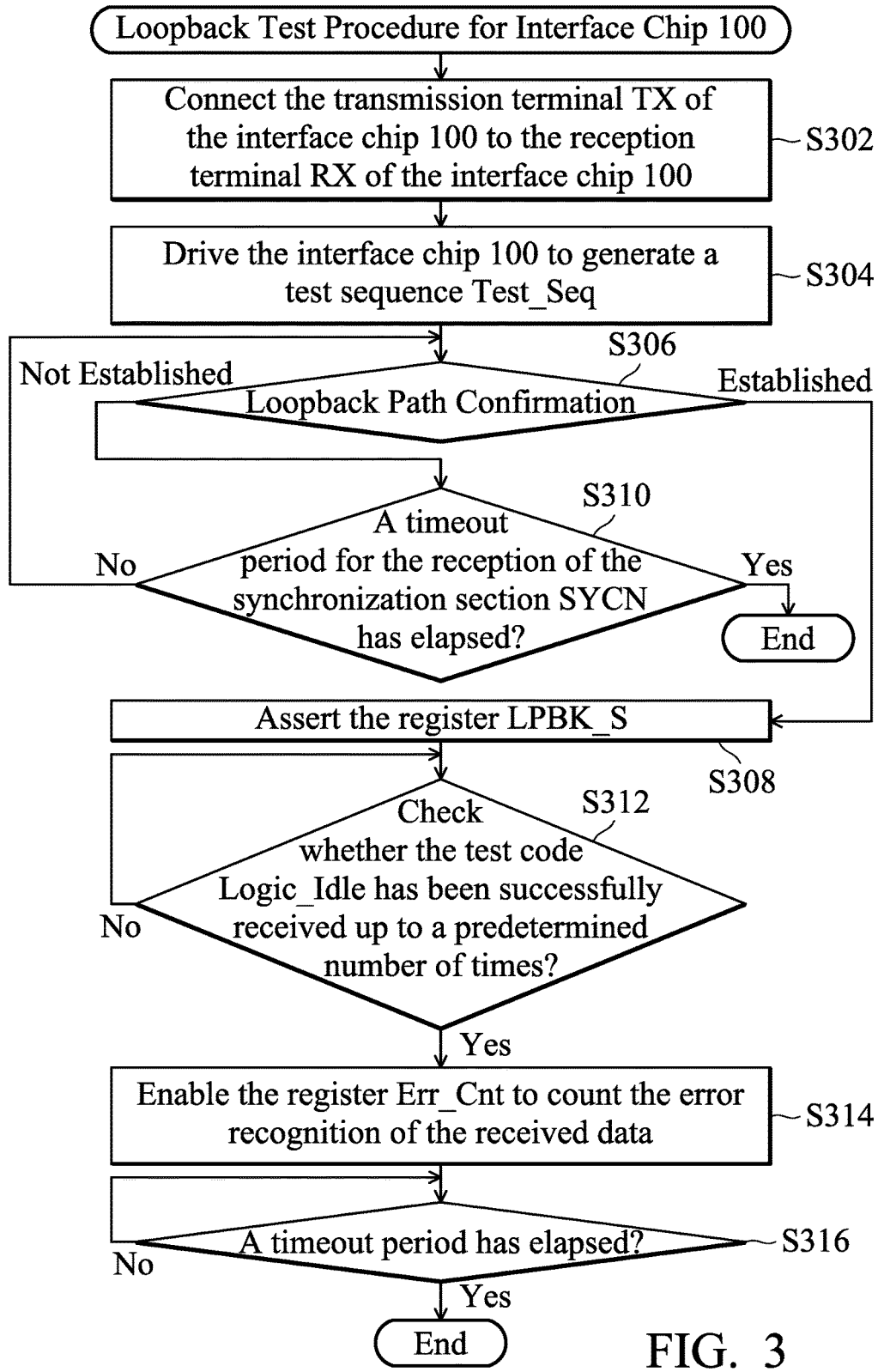
FIG. 3 is a flowchart, depicting a loopback test procedure for the interface chip 100 in accordance with an exemplary embodiment of the disclosure.

FIG. 3 is a flowchart, depicting a loopback test procedure for the interface chip 100 in accordance with an exemplary embodiment of the disclosure.

In step S302, the transmission terminal TX of the interface chip 100 is connected to the reception terminal RX of the interface chip 100. In step S304, the interface chip 100 generates a test sequence Test_Seq like that shown in FIG. 2. Step S306 confirms the establishment of the loopback path once the reception of a synchronization section SYNC is confirmed. Because it takes time to train the equalizer 106, repeated transmission, as shown in FIG. 2, of the synchronization section SYNC and the code section Repeated_P helps to train the equalizer 106 to have the ability to recognize the synchronization section SYNC. A sufficient training time benefits the training of the equalizer 106. The parameters of the equalizer 106 are optimized by the first few repeated and scrambled code sections Repeated_P. When the loopback path is confirmed in step S306, the training time is long enough and the parameters in the equalizer 106 have been optimized. Step S308 is performed to assert the register LPBK_S. When the reception of the synchronization section SYNC fails to be confirmed in step S306, step S310 is performed to determine whether a timeout period for the reception of the synchronization section SYCN has elapsed. The loopback test procedure ends once the timeout period has elapsed. The register LPBK_S which has not been asserted means that the transmission terminal TX of the interface chip 100 is malfunctioning and cannot transmit signals, or that the reception terminal RX of the interface chip 100 is malfunctioning and cannot receive signals.

After step S308, step S312 is performed to check whether the test code Logic_Idle has been successfully received up to a predetermined number of times (e.g. up to 4 times). If yes, the register Err_Cnt is enabled to count the error recognition of the received data (S314). Every time the data checker 114 determines that the received data is neither the synchronization section nor the test code Logic_Idle, the loopback test circuit 102 increases the error count record in the register Err_Cnt. When it is determined in step S316 that a timeout period has elapsed, the loopback test procedure ends. This design of step S312 not only ensures the reliability of the loopback path but also avoids misjudgment of the scrambled test code Logic_Idle. Step S312 is optional and may be omitted. The interface chip 100 verified in accordance with a greater threshold value for the error count record in the register Err_Cnt may be less reliable.

Any built-in self-test mechanism for an interface chip based on the forgoing concepts is believed to be within the scope of the invention. Based on the forgoing tests, the invention further involves test methods for interface chips.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interface chip, comprising:
a transmission terminal and a reception terminal;
a loopback test circuit, generating a test sequence that includes a synchronization section and a section of repeated test code following the synchronization section;
a scrambler, scrambling the test sequence to be transmitted by the transmission terminal and looped back to the interface chip via the reception terminal; and
an equalizer and a descrambler, wherein the equalizer processes the scrambled test sequence transmitted by the interface chip via the transmission terminal and looped back to the interface chip via the reception terminal and after being processed by the equalizer, the scrambled test sequence is descrambled by the descrambler and then checked by the loopback test circuit to determine whether the interface chip is functioning normally,
wherein:
dynamically-changed keys used in the scrambler and the descrambler are synchronized in accordance with the synchronization section; and
the equalizer is optimized by the scrambled section of repeated test code.

2. The interface chip as claimed in claim 1, further comprising:
a first register for loopback path confirmation, which is asserted when the loopback test circuit successfully receives the synchronization section,
wherein the first register is also used in determining whether the interface chip is functioning normally.

3. The interface chip as claimed in claim 2, wherein:
after a timeout period elapses, the first register that has not been asserted shows that the interface chip is malfunctioning.

4. The interface chip as claimed in claim 1, wherein:
N occurrences of correct recognition of the test code are required before recognition errors of the test code are adopted in determining whether the interface chip is functioning normally.

5. The interface chip as claimed in claim 4, further comprising:
a second register for recording the adopted recognition errors, wherein an error count record in the second register is also used in determining whether the interface chip is functioning normally, and after the N occurrences of correct recognition of the test code, every time the loopback test circuit recognizes data not matching the synchronization section or the test code, the error count in the second register is increased.

6. The interface chip as claimed in claim 5, wherein:
after a timeout period elapses, the error count record in the second register being greater than a threshold value means that the interface chip is malfunctioning.

7. The interface chip as claimed in claim 1, wherein:
the dynamically-changed keys used in the scrambler and the descrambler depend on data received by the scrambler and the descrambler.

8. The interface chip as claimed in claim 1, wherein:
the loopback test circuit repeatedly transmits the synchronization section and the section of repeated test code.

9. The interface chip as claimed in claim 8, wherein:
the loopback test circuit further inserts time compensation code into the test sequence; and
the time compensation code is removed before being looped back to the loopback test circuit.

10. The interface chip as claimed in claim 1, wherein:
the test code to be repeated is 5A.

11. A test method for an interface chip, comprising:
coupling a transmission terminal of the interface chip back to the interface chip via a reception terminal of the interface chip;
driving the interface chip to generate a test sequence that includes a synchronization section and a section of repeated test code following the synchronization section;
using a scrambler of the interface chip to scramble the test sequence and transmitting the scrambled test sequence via the transmission terminal to be further looped back to the interface chip via the reception terminal; and
operating an equalizer and a descrambler of the interface chip, wherein the equalizer processes the scrambled test sequence that the reception terminal receives from the transmission terminal and after being processed by the equalizer, the scrambled test sequence is descrambled by the descrambler and then is checked to determine whether the interface chip is functioning normally,
wherein:
dynamically-changed keys used in the scrambler and the descrambler are synchronized in accordance with the synchronization section; and
the equalizer is optimized by the scrambled section of repeated test code.

12. The test method as claimed in claim 11, further comprising:
providing a first register for loopback path confirmation, which is asserted when the synchronization section successfully returns the interface chip,
wherein the first register is also used in determining whether the interface chip is functioning normally.

13. The test method as claimed in claim 12, wherein:
after a timeout period elapses, the first register that has not been asserted shows that the interface chip is malfunctioning.

14. The test method as claimed in claim 11, wherein:
N occurrences of correct recognition of the test code are required before recognition errors of the test code are adopted in determining whether the interface chip is functioning normally.

15. The test method as claimed in claim 14, further comprising:
providing a second register for recording the adopted recognition errors, wherein an error count record in the second register is also used in determining whether the interface chip is functioning normally, and after N occurrences of correct recognition of the test code, the error count in the second register is increased every time data not matching the synchronization section or the test code is recognized.

16. The test method as claimed in claim 15, wherein:
after a timeout period elapses, the error count record in the second register being greater than a threshold value means that the interface chip is malfunctioning.

17. The test method as claimed in claim 11, wherein:
the dynamically-changed keys used in the scrambler and the descrambler depend on data received by the scrambler and the descrambler.

18. The test method as claimed in claim 11, wherein:
the synchronization section and the section of repeated test code are repeatedly transmitted.

19. The test method as claimed in claim 18, further comprising:

inserting a time compensation code into the test sequence, wherein the time compensation code is removed after being received by the reception terminal.

20. The test method as claimed in claim 11, wherein: the test code to be repeated is 5A.

* * * * *